US011218151B2

(12) United States Patent
Choi

(10) Patent No.: US 11,218,151 B2
(45) Date of Patent: Jan. 4, 2022

(54) SYSTEM FOR PERFORMING A PHASE CONTROL OPERATION

(71) Applicant: SK hynix Inc., Icheon-si (KR)

(72) Inventor: Geun Ho Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/005,095

(22) Filed: Aug. 27, 2020

(65) Prior Publication Data
US 2021/0359689 A1    Nov. 18, 2021

(30) Foreign Application Priority Data

May 15, 2020 (KR) .......................... 10-2020-0058338

(51) Int. Cl.
*H03L 7/081* (2006.01)
*H03L 1/02* (2006.01)
*H03L 7/07* (2006.01)

(52) U.S. Cl.
CPC ............ *H03L 7/0814* (2013.01); *H03L 1/022* (2013.01); *H03L 7/07* (2013.01); *H03L 7/0816* (2013.01)

(58) Field of Classification Search
CPC ..... H03L 7/099; H03L 7/0991; H03L 7/0992; H03L 7/0814; H03L 7/0816; H03L 7/07; H03L 1/1022; H03L 7/093; H03L 7/189; H03L 7/191
See application file for complete search history.

(56) References Cited

U.S. PATENT DOCUMENTS

| 6,417,715 | B2 * | 7/2002 | Hamamoto | H03L 7/087 327/291 |
| 7,071,746 | B2 * | 7/2006 | Suda | H03K 5/135 327/158 |
| 10,002,651 | B2 * | 6/2018 | Choi | G11C 7/109 |

FOREIGN PATENT DOCUMENTS

KR    1020130135587 A    12/2013

* cited by examiner

*Primary Examiner* — Hai L Nguyen
(74) *Attorney, Agent, or Firm* — William Park & Associates Ltd.

(57) ABSTRACT

A system for performing a phase control operation includes: an internal clock generation circuit configured to generate an internal clock by delaying a clock by a first delay variation, and generate a reference clock by delaying the clock by a second delay variation, wherein the internal clock generation circuit generates the internal clock by delaying the clock by the first delay variation which is controlled according to a phase difference between the internal clock and the reference clock; and a data input/output circuit configured to input/output data in synchronization with the internal clock.

31 Claims, 12 Drawing Sheets

SYSTEM FOR PERFORMING A PHASE CONTROL OPERATION

CROSS-REFERENCES TO RELATED APPLICATION

The present application claims priority under 35 U.S.C. § 119(a) to Korean application number 10-2020-0058338, filed on May 15, 2020, in the Korean Intellectual Property Office, which is incorporated herein by reference in its entirety.

BACKGROUND

1. Technical Field

Various embodiments generally relate to a system for performing a phase control operation to control the phase of an internal clock according to a PVT (Process Voltage Temperature) variation.

2. Related Art

Recently, with the increase in operating speed of a semiconductor system, a high transfer rate is required between semiconductor devices included in the semiconductor system. In order to satisfy a high transfer rate or high bandwidth for data which are input/output in series between the semiconductor devices, new techniques are applied. For example, a clock dividing technique is used to input/output data at high speed. When the frequency of the clock is divided, internal clocks having different phases are generated. The semiconductor system deserializes or serializes data using the internal clocks, and inputs/outputs the data at high speed.

When an internal PVT variation of the semiconductor system occurs, an internal clock whose frequency is divided and a clock input from outside become out of phase to cause an operation error of the semiconductor system. Thus, various methods for compensating for such a PVT variation are suggested.

SUMMARY

In an embodiment, a system for performing a phase control operation may include: an internal clock generation circuit configured to generate an internal clock by delaying a clock by a first delay variation, and generate a reference clock by delaying the clock by a second delay variation, wherein the internal clock generation circuit generates the internal clock by delaying the clock by the first delay variation which is controlled according to a phase difference between the internal clock and the reference clock; and a data input/output circuit configured to input/output data in synchronization with the internal clock.

In an embodiment, a system for performing a phase control operation may include: a delay amount control circuit configured to generate first to fourth target codes and first to fourth reference codes, having logic level combinations that are changed by a phase detection signal, in synchronization with a clock; a target path circuit configured to control a first delay variation according to the logic level combination of the first to fourth target codes, and generate an internal clock by delaying a divided clock according to the controlled first delay variation; and a reference path circuit configured to control a second delay variation according to the logic level combination of the first to fourth reference codes, and generate a reference clock by delaying the divided clock according to the controlled second delay variation.

DETAILED DESCRIPTION

The term "preset" indicates that the value of a parameter is previously decided, when the parameter is used in a process or algorithm. According to an embodiment, the value of the parameter may be set when the process or algorithm is started or while the process or algorithm is performed.

The terms such as "first" and "second", which are used to distinguish among various components, are not limited by the components. For example, a first component may be referred to as a second component, and vice versa.

When one component is referred to as being "coupled" or "connected" to another component, it may indicate that the components are directly coupled or connected to each other or coupled or connected to each other through another component interposed therebetween. On the other hand, when one component is referred to as being "directly coupled" or "directly connected" to another component, it may indicate that the components are directly coupled or connected to each other without another component interposed therebetween.

"Logic high level" and "logic low level" are used to describe the logic levels of signals. A signal having "logic high level" is distinguished from a signal having "logic low level". For example, when a signal having a first voltage corresponds to "logic high level", a signal having a second voltage may correspond to "logic low level". According to an embodiment, "logic high level" may be set to a voltage higher than "logic low level". According to an embodiment, the logic levels of signals may be set to different logic levels or opposite logic levels. For example, a signal having a logic high level may be set to have a logic low level according to an embodiment, and a signal having a logic low level may be set to have a logic high level according to an embodiment.

Hereafter, the present disclosure will be described in more detail through embodiments. The embodiments are only used to exemplify the present disclosure, and the scope of the present disclosure is not limited by the embodiments.

Various embodiments may be directed to a system for performing a phase control operation, which can control the phase of an internal clock by differentially controlling delay variations for different paths according to a PVT variation.

In accordance with the present embodiments, the system may control the phase of the internal clock by differently controlling delay variations for difference paths according to a PVT variation.

Furthermore, the system may input/output data by compensating for the phase of the internal clock according to a PVT variation, thereby preventing an operation error.

Figure 1:
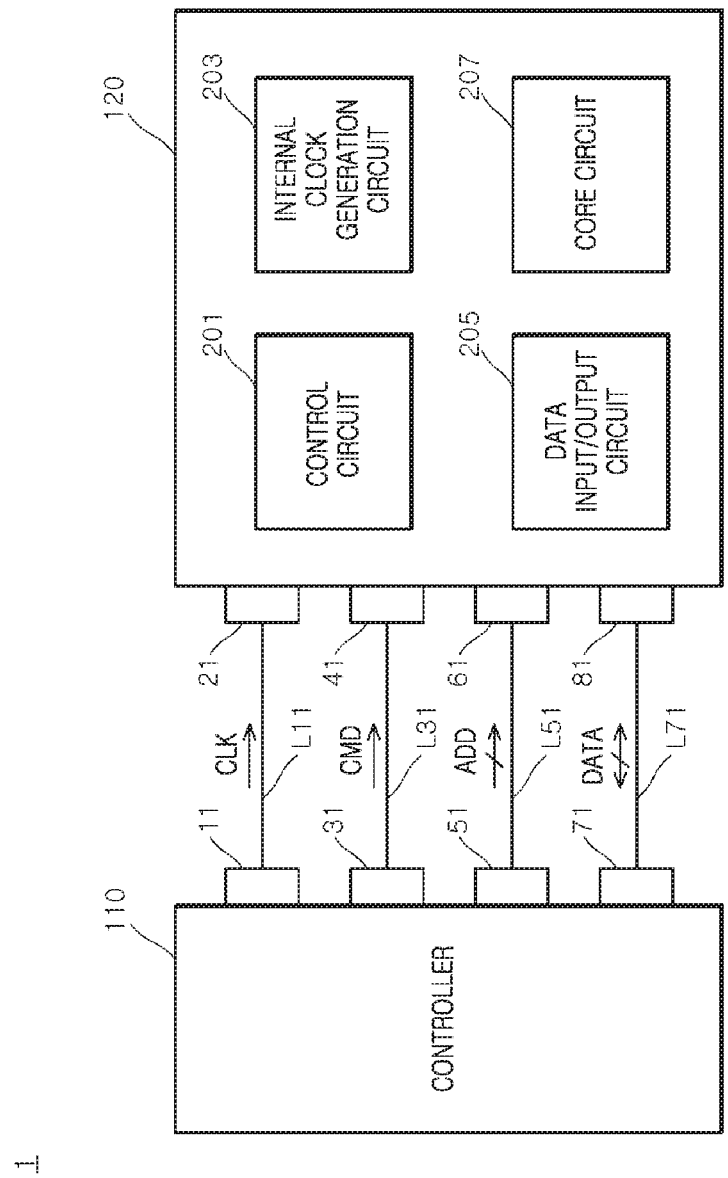
FIG. 1 is a block diagram illustrating a configuration of a system for performing a phase control operation in accordance with an embodiment.

As illustrated in FIG. 1, a system 1 for performing a phase control operation in accordance with an embodiment may include a controller 110 and a semiconductor device 120. The semiconductor device 120 may include a control circuit 201, an internal clock generation circuit 203, a data input/output circuit 205 and a core circuit 207.

The controller 110 may include a first control pin 11, a second control pin 31, a third control pin 51 and a fourth control pin 71. The semiconductor device 120 may include a first semiconductor pin 21, a second semiconductor pin 41, a third semiconductor pin 61 and a fourth semiconductor pin 81. A first transmission line 11 may be coupled between the first control pin 11 and the first semiconductor pin 21. A second transmission line L31 may be coupled between the second control pin 31 and the second semiconductor pin 41. A third transmission line L51 may be coupled between the third control pin 51 and the third semiconductor pin 61. A fourth transmission line L71 may be coupled between the fourth control pin 71 and the fourth semiconductor pin 81. The controller 110 may transmit a clock CLK to the semiconductor device 120 through the first transmission line 11 in order to control the semiconductor device 120. The controller 110 may transmit a command CMD to the semiconductor device 120 through the second transmission line L31 in order to control the semiconductor device 120. The controller 110 may transmit an address ADD to the semiconductor device 120 through the third transmission line L51 in order to control the semiconductor device 120. The controller 110 and the semiconductor device 120 may transmit and receive data DATA through the fourth transmission line L71.

The controller 110 may output, to the semiconductor device 120, the clock CLK, the command CMD, the address ADD and the data DATA for performing a normal operation. The normal operation may include a write operation and a read operation of the semiconductor device 120. The command CMD, the address ADD and the data DATA may be consecutively output in synchronization with odd pulses or even pulses included in the clock CLK.

The control circuit 201 may control the normal operation according to the command CMD and the address ADD in synchronization with the clock CLK.

The internal clock generation circuit 203 may perform a phase control operation of controlling the phase of an internal clock (ICLK of FIG. 2) in order to control an input/output time point of the data DATA during the normal operation.

Figure 2:
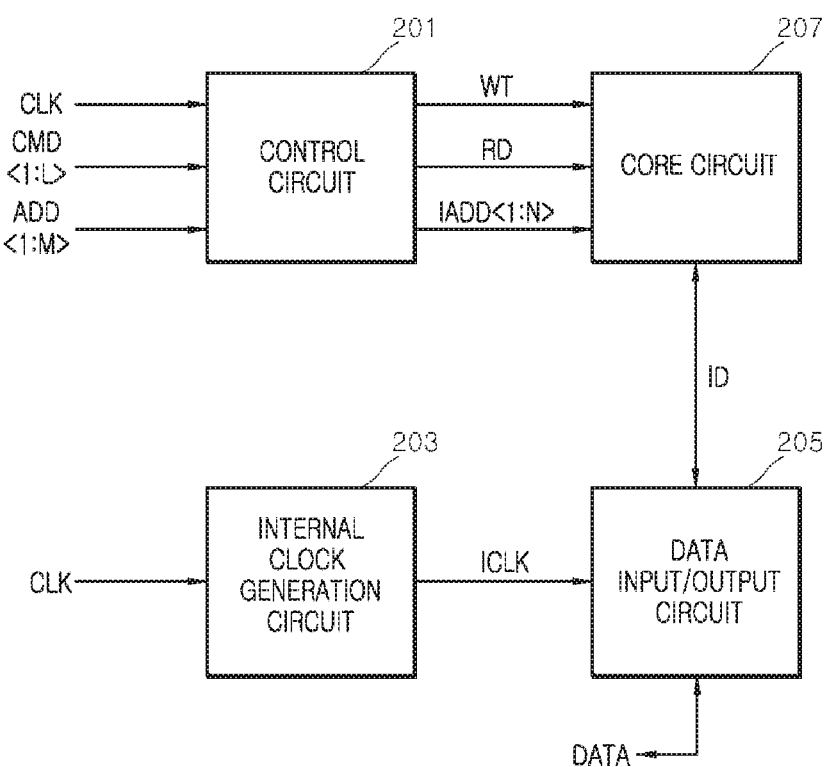
FIG. 2 is a block diagram illustrating a configuration of a semiconductor device included in the system for performing a phase control operation, which is illustrated in FIG. 1.

The data input/output circuit 205 may input/output the data DATA in synchronization with the internal clock (ICLK of FIG. 2).

The core circuit 207 may perform the write operation and the read operation according to the clock CLK, the command CMD, the address ADD and the data DATA.

FIG. 2 is a block diagram illustrating a configuration of the semiconductor device 120 in accordance with an embodiment. As illustrated in FIG. 2, the semiconductor device 120 may include the control circuit 201, the internal clock generation circuit 203, the data input/output circuit 205 and the core circuit 207.

The control circuit 201 may generate a write signal WT, a read signal RD and an internal address IADD<1:N> for controlling the normal operation according to a command CMD<1:L> and an address ADD<1:M> in synchronization with the clock CLK. The control circuit 201 may generate the write signal WT for performing the write operation by decoding the command CMD<1:L> in synchronization with the clock CLK. The control circuit 201 may generate the read signal RD for performing the read operation by decoding the command CMD<1:L> in synchronization with the clock CLK. The control circuit 201 may generate the internal address IADD<1:N> for performing a write operation and a read operation by decoding the address ADD<1:M> in synchronization with the clock CLK. The number L of bits included in the command CMD<1:L> may be set to various values according to an embodiment. The number 'M' of bits included in the address ADD<1:M> may be set to various values according to an embodiment. The number 'N' of bits included in the internal address IADD<1:N> may be set to various values according to an embodiment. The operation of the control circuit 201 to generate the write signal WT, the read signal RD and the internal address IADD<1:N> will be described with reference to FIG. 3 which will be described below.

The internal clock generation circuit 203 may generate the internal clock ICLK by controlling the phase of the clock CLK. The internal clock generation circuit 203 may control first and second delay control amounts for delaying the clock CLK. The internal clock generation circuit 203 may generate the internal clock ICLK by delaying the clock CLK according to the controlled first and second delay control amounts. The operation of the internal clock generation circuit 203 to control the first and second delay control amounts for delaying the clock CLK will be described with reference to FIGS. 4 to 11.

The data input/output circuit 205 may input/output the data DATA in synchronization with the internal clock ICLK. The data input/output circuit 205 may receive the data DATA output from the controller 110 and generate internal data ID, in synchronization with the internal clock ICLK during a write operation. The data input/output circuit 205 may receive the internal data ID output from the core circuit 207 and generate the data DATA, in synchronization with the internal clock ICLK during a read operation. The data input/output circuit 205 may output the data DATA to the controller 110 during the read operation.

The core circuit 207 may be implemented as a plurality of memory cells. The core circuit 207 may store internal data ID according to the write signal WT and the internal address IADD<A:N> which are enabled during the write operation. The core circuit 207 may output the internal data ID stored therein according to the read signal RD and the internal address IADD<A:N> which are enabled during the read operation.

Figure 3:
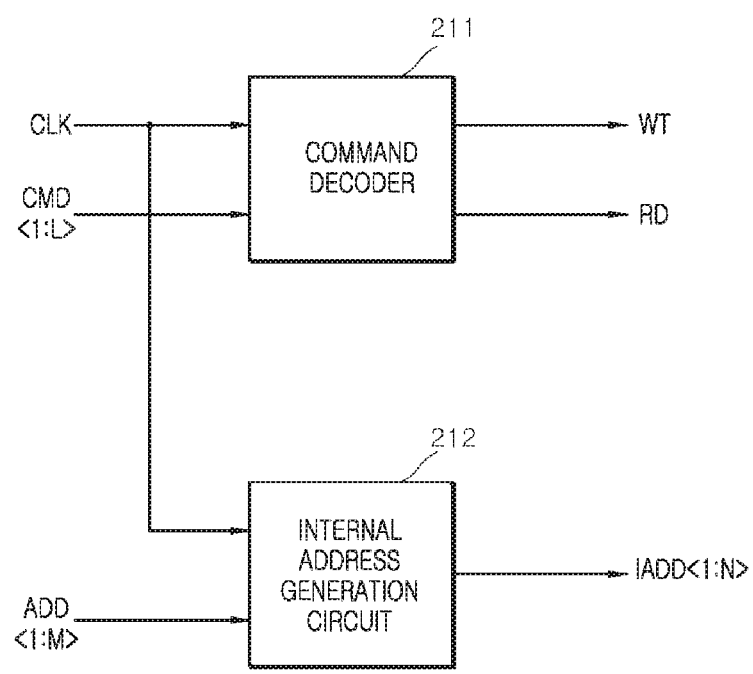
FIG. 3 is a block diagram illustrating a configuration of a control circuit included in the semiconductor device illustrated in FIG. 2.

FIG. 3 is a block diagram illustrating a configuration of the control circuit 201 in accordance with an embodiment. As illustrated in FIG. 3, the control circuit 201 may include a command decoder 211 and an internal address generation circuit 212.

The command decoder 211 may generate the write signal WT and the read signal RD, which are selectively enabled, by decoding the command CMD<1:L> in synchronization with the clock CLK. The command decoder 211 may generate the write signal WT for performing the write operation by decoding the command CMD<1:L> in synchronization with the clock CLK. The command decoder 211 may generate the read signal RD for performing the read operation by decoding the command CMD<1:L> in synchronization with the clock CLK.

The internal address generation circuit 212 may generate an internal address IADD<1:N> which is selectively enabled, by decoding the address ADD<1:M> in synchronization with the clock CLK. The internal address generation circuit 212 may generate the internal address IADD<1:N> for performing a write operation and a read operation by decoding the address ADD<1:M> in synchronization with the clock CLK.

Figure 4:
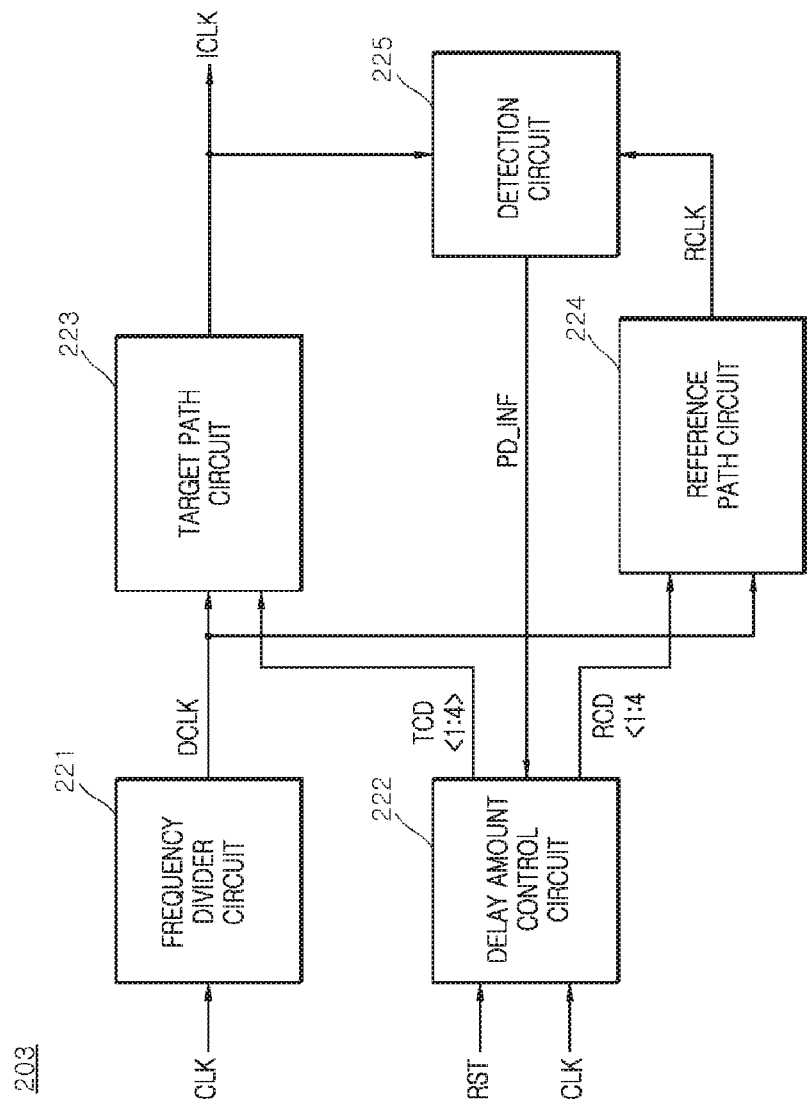
FIG. 4 is a block diagram illustrating a configuration of an internal clock generation circuit included in the semiconductor device illustrated in FIG. 2.

FIG. 4 is a block diagram illustrating a configuration of the internal clock generation circuit 203 in accordance with an embodiment. As illustrated in FIG. 4, the internal clock generation circuit 203 may include a frequency divider circuit 221, a delay amount control circuit 222, a target path circuit 223, a reference path circuit 224 and a detection circuit 225.

The frequency divider circuit 221 may generate a divided clock DCLK by dividing the frequency of the clock CLK. The frequency divider circuit 221 may generate the divided clock DCLK having a frequency corresponding to ½ of the frequency of the clock CLK, in synchronization with the clock CLK.

The delay amount control circuit 222 may generate first to fourth target codes TCD<1:4> having a logic level combination that is changed by a phase detection signal PD_INF, in synchronization with the clock CLK. The delay amount control circuit 222 may generate first to fourth reference codes RCD<1:4> having a logic level combination that is changed by the phase detection signal PD_INF, in synchronization with the clock CLK. The delay amount control circuit 222 may generate the first to fourth reference codes RCD<1:4> after generating the first to fourth target codes TCD<1:4> having a logic level combination that is changed by the phase detection signal PD_INF in synchronization with the clock CLK. The priority to generate the first to fourth target codes TCD<1:4> and the first to fourth reference codes RCD<1:4> may be set in various manners according to an embodiment.

The target path circuit 223 may generate the internal clock ICLK by delaying the divided clock DCLK. The target path circuit 223 may have a first delay variation which is controlled according to the logic level combination of the first to fourth target codes TCD<1:4>. The target path circuit 223 may generate the internal clock ICLK by delaying the divided clock DCLK according to the controlled first delay variation.

The reference path circuit 224 may generate a reference clock RCLK by delaying the divided clock DCLK. The reference path circuit 224 may have a second delay variation which is controlled according to the logic level combination of the first to fourth reference codes RCD<1:4>. The reference path circuit 224 may generate the reference clock RCLK by delaying the divided clock DCLK according to the controlled second delay variation.

The detection circuit 225 may generate the phase detection signal PD_INF according to a phase difference between the internal clock ICLK and the reference clock RCLK. The detection circuit 225 may generate the phase detection signal PD_INF by comparing the phases of the internal clock ICLK and the reference clock RCLK. The detection circuit 225 may generate the phase detection signal PD_INF which is enabled when the internal clock ICLK and the reference clock RCLK are out of phase. The logic level of the enabled phase detection signal PD_INF may be set to various logic levels according to an embodiment. For example, the logic level to which the phase detection signal PD_INF is enabled may be set to a first logic level (logic high level). The logic level to which the phase detection signal PD_INF is enabled may be set to a second logic level (logic low level).

Figure 5:
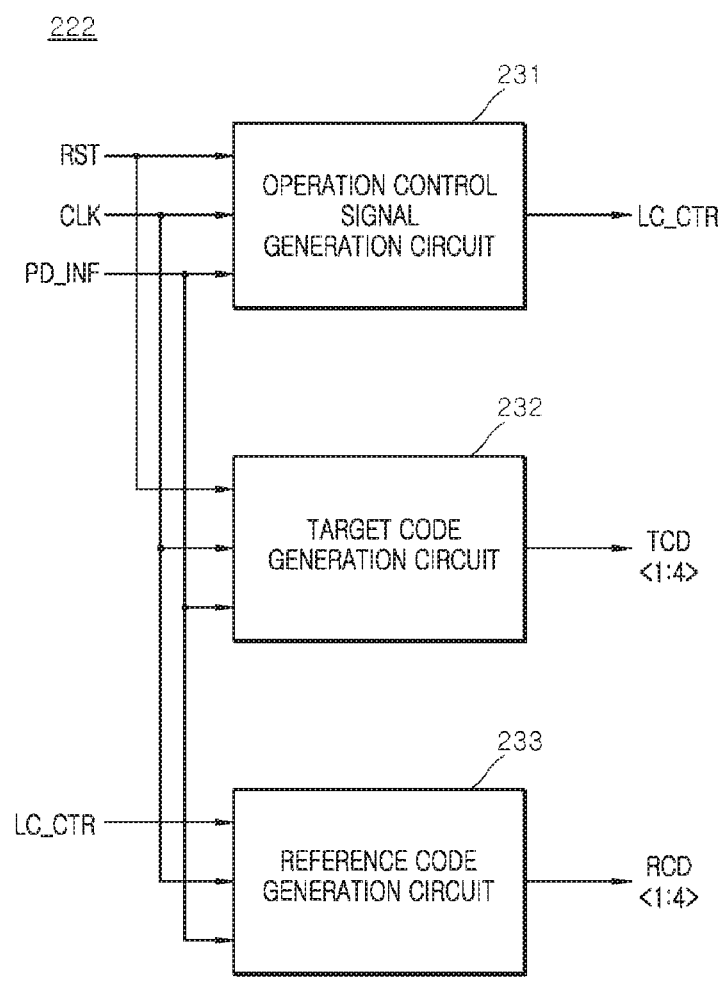
FIG. 5 is a block diagram illustrating a configuration of a delay amount control circuit included in the internal clock generation circuit illustrated in FIG. 4.

FIG. 5 is a block diagram illustrating a configuration of the delay amount control circuit 222 in accordance with an embodiment. As illustrated in FIG. 5, the delay amount control circuit 222 may include an operation control signal generation circuit 231, a target code generation circuit 232 and a reference code generation circuit 233.

The operation control signal generation circuit 231 may generate an operation control signal LC_CTR which is disabled by a reset signal RST. The operation control signal generation circuit 231 may generate the operation control signal LC_CTR, which is enabled based on the phase detection signal PD_INF, in synchronization with the clock CLK.

The target code generation circuit 232 may generate the first to fourth target codes TCD<1:4> having a logic level combination that is changed according to the logic level of the phase detection signal PD_INF, in synchronization with the clock CLK. The target code generation circuit 232 may generate the first to fourth target codes TCD<1:4> which are up-counted when the phase detection signal PD_INF is enabled, in synchronization with the clock CLK. The target code generation circuit 232 may generate the first to fourth target codes TCD<1:4> which are down-counted when the phase detection signal PD_INF is disabled, in synchronization with the clock CLK.

The reference code generation circuit 233 may generate the first to fourth reference codes RCD<1:4> having a logic level combination that is changed according to the logic level of the phase detection signal PD_INF, in synchronization with the clock CLK, after the operation control signal LC_CTR is enabled. The reference code generation circuit 233 may generate the first to fourth reference codes RCD<1:4> which are up-counted when the phase detection signal PD_INF is enabled, in synchronization with the clock CLK, after the operation control signal LC_CTR is enabled. The reference code generation circuit 233 may generate the first to fourth reference codes RCD<1:4> which are down-counted when the phase detection signal PD_INF is disabled, in synchronization with the clock CLK, after the operation control signal LC_CTR is enabled.

Figure 6:
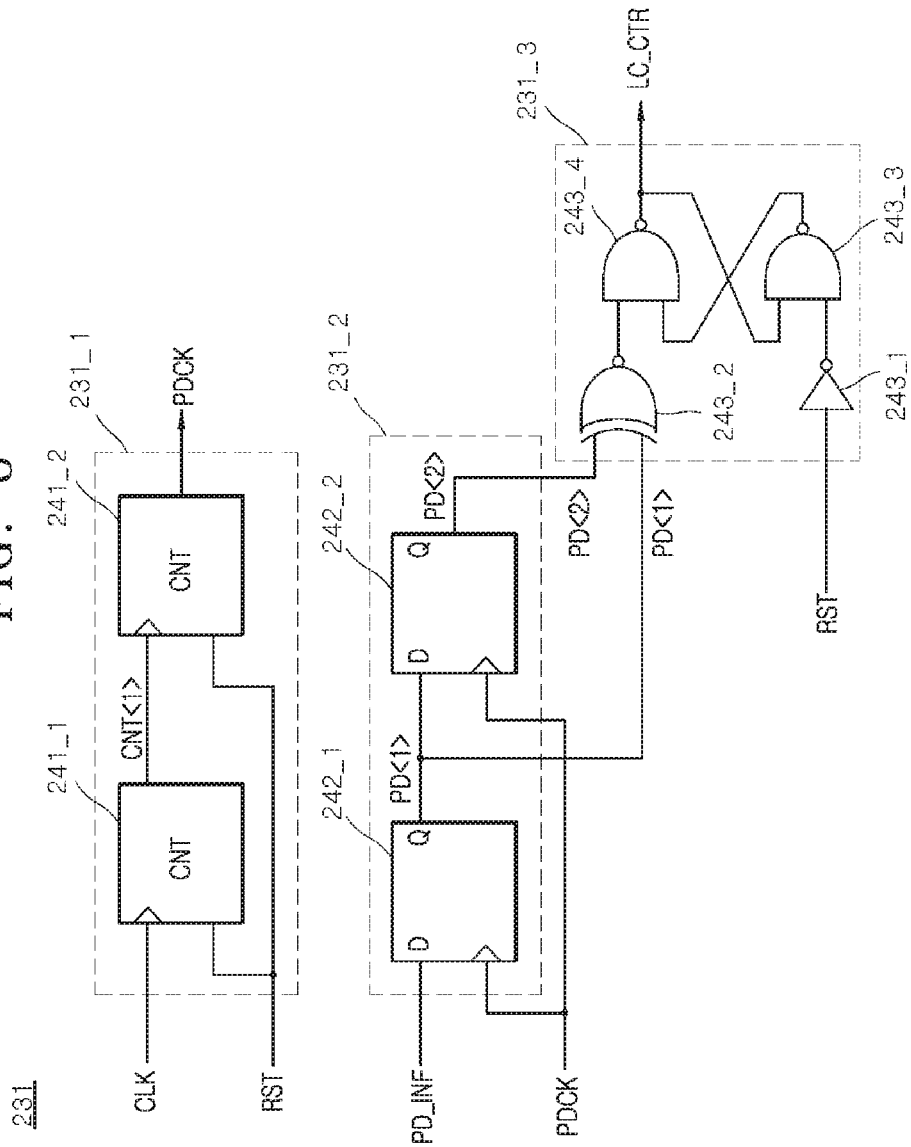
FIG. 6 is a diagram illustrating a configuration of an operation control signal generation circuit included in the delay amount control circuit illustrated in FIG. 5.

FIG. 6 is a diagram illustrating a configuration of the operation control signal generation circuit 231 in accordance with an embodiment. As illustrated in FIG. 6, the operation control signal generation circuit 231 may include a phase clock generation circuit 231_1, a phase delay signal generation circuit 231_2 and a latch circuit 231_3.

The phase clock generation circuit 231_1 may be implemented using counters 241_1 and 241_2.

The counter 241_1 may generate a first counting signal CNT<1> which is disabled to a logic low level by the reset signal RST. The counter 241_1 may generate the first counting signal CNT<1> which is enabled to a logic high level when a pulse of the clock CLK transitions from a logic high level to a logic low level. The counter 241_2 may generate a phase clock PDCK which is disabled to a logic low level by the reset signal RST. The counter 241_2 may generate the phase clock PDCK which is enabled to a logic high level when the pulse of the first counting signal CNT<1> transitions from a logic high level to a logic low level.

The phase clock generation circuit 231_1 may generate the phase clock PDCK which is disabled by the reset signal RST. The phase clock generation circuit 231_1 may generate the phase clock PDCK which is enabled in synchronization with the clock CLK. The phase clock generation circuit 231_1 may generate the phase clock PDCK which is reset by the reset signal RST and then enabled when two pulses of the clock CLK are input after the phase clock PDCK is reset by the reset signal RST.

The phase delay signal generation circuit 231_2 may be implemented using flip-flops 242_1 and 242_2.

The flip-flops 242_1 may generate a first phase delay signal PD<1> by shifting the phase detection signal PD_INF in synchronization with the phase clock PDCK. The flip-flop 242_2 may generate a second phase delay signal PD<2> by shifting the first phase delay signal PD<1> in synchronization with the phase clock PDCK.

The phase delay signal generation circuit 231_2 may generate the first phase delay signal PD<1> and the second phase delay signal PD<2>, which are sequentially enabled, by shifting the phase detection signal PD_INF in synchronization with the phase clock PDCK.

The latch circuit 231_3 may include an inverter 243_1, an XOR gate 243_2 and NAND gates 243_4 and 243_4.

The latch circuit 231_3 may generate the operation control signal LC_CTR which is disabled to a logic low level when the reset signal RST is input at a logic high level. The latch circuit 231_3 may generate the operation control signal LC_CTR which is enabled to a logic high level when the first phase delay signal PD<1> and the second phase delay signal PD<2> are at different logic levels. The latch circuit 231_3 may generate the operation control signal LC_CTR which is disabled to a logic low level when the first phase delay signal PD<1> and the second phase delay signal PD<2> are at the same logic level. In an embodiment, the latch circuit 231_3 may generate the operation control signal LC_CTR which is disabled when the reset signal RST is input, and enabled when the first and second phase delay signals PD<1> and PD<2> are different logic level combinations.

Figure 7:
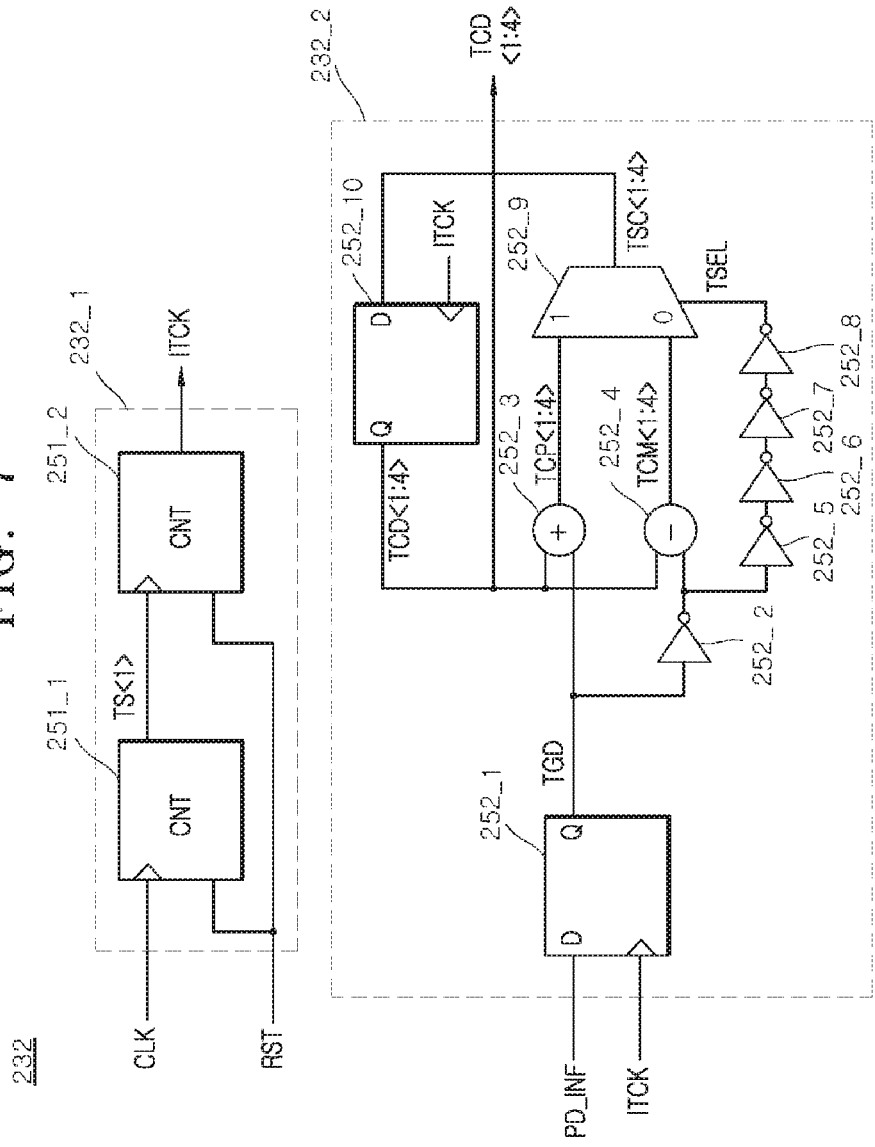
FIG. 7 is a diagram illustrating a configuration of a target code generation circuit included in the delay amount control circuit illustrated in FIG. 5.

FIG. 7 is a diagram illustrating a configuration of the target code generation circuit 232 in accordance with an embodiment. As illustrated in FIG. 7, the target code generation circuit 232 may include an internal target clock generation circuit 232_1 and a target code control circuit 232_2.

The internal target clock generation circuit 232_1 may be implemented using counters 251_1 and 251_2.

The counter 251_1 may generate a first transfer signal TS<1> which is disabled to a logic low level by the reset signal RST. The counter 251_1 may generate the first transfer signal TS<1> which is enabled to a logic high level when a pulse of the clock CLK transitions from a logic high level to a logic low level. The counter 251_2 may generate an internal target clock ITCK which is disabled to a logic low level by the reset signal RST. The counter 251_2 may generate the internal target clock ITCK which is enabled to a logic high level when the pulse of the first transfer signal TS<1> transitions from a logic high level to a logic low level.

The internal target clock generation circuit 232_1 may generate the internal target clock ITCK which is disabled by the reset signal RST. The internal target clock generation circuit 232_1 may generate the internal target clock ITCK which is enabled in synchronization with the clock CLK. The internal target clock generation circuit 232_1 may generate the internal target clock ITCK which is enabled when two pulses of the clock CLK are input after the internal target clock ITCK is reset by the reset signal RST.

The target code control circuit 232_2 may include a flip-flop 252_1, an inverter 252_2, an adder 252_3, a subtractor 252_4, delay circuits 252_5 to 252_8, a selection transmitter 252_9 and a flip-flop 252_10.

The flip-flop 252_1 may output the phase detection signal PD_INF as a target delay signal TGD in synchronization with the internal target clock ITCK. The flip-flop 252_1 may output the phase detection signal PD_INF as the target delay signal TGD when a pulse of the internal target clock ITCK is input at a logic high level.

The inverter 252_2 may invert and buffer the target delay signal TGD, and output the buffered signal.

The adder 252_3 may generate first to fourth target addition codes TCP<1:4> by up-counting the first to fourth target codes TCD<1:4> according to the logic level of the target delay signal TGD. The adder 252_3 may generate the first to fourth target addition codes TCP<1:4> by sequentially up-counting the first to fourth target codes TCD<1:4> when the target delay signal TGD is at a logic high level.

The subtractor 252_4 may generate first to fourth target subtraction codes TCM<1:4> by down-counting the first to fourth target codes TCD<1:4> according to the logic level of an output signal of the inverter 252_2. The subtractor 252_4 may generate the first to fourth target subtraction codes TCM<1:4> by sequentially down-counting the first to fourth target codes TCD<1:4> when the output signal of the inverter 252_2 is at a logic low level. That is, the subtractor 252_4 may generate the first to fourth target subtraction codes TCM<1:4> by sequentially down-counting the first to fourth target codes TCD<1:4> when the target delay signal TGD is at a logic high level.

The delay circuits 252_5 to 252_8 may be implemented as an inverter chain. The delay circuits 252_5 to 252_8 may generate a target selection signal TSEL by delaying the output signal of the inverter 252_2.

The selection transmitter 252_9 may output any ones of the first to fourth target addition codes TCP<1:4> and the first to fourth target subtraction codes TCM<1:4> as first to fourth target selection codes TSC<1:4> according to the logic level of the target selection signal TSEL. When the target selection signal TSEL is at a logic low level, the selection transmitter 252_9 may output the first to fourth target addition codes TCP<1:4> as the first to fourth target selection codes TSC<1:4>. When the target selection signal TSEL is at a logic high level, the selection transmitter 252_9 may output the first to fourth target subtraction codes TCM<1:4> as the first to fourth target selection codes TSC<1:4>.

The flip-flop 252_10 may output the first to fourth target selection codes TSC<1:4> as the first to fourth target codes TCD<1:4> in synchronization with the internal target clock ITCK. The flip-flop 252_10 may output the first to fourth target selection codes TSC<1:4> as the first to fourth target codes TCD<1:4> when a pulse of the internal target clock ITCK is input at a logic high level. FIG. 7 illustrates the flip-flop 252_10 as one flip-flop, but the flip-flop 252_10 may be implemented as four flip-flops for generating the first to fourth target codes TCD<1:4>.

Figure 8:
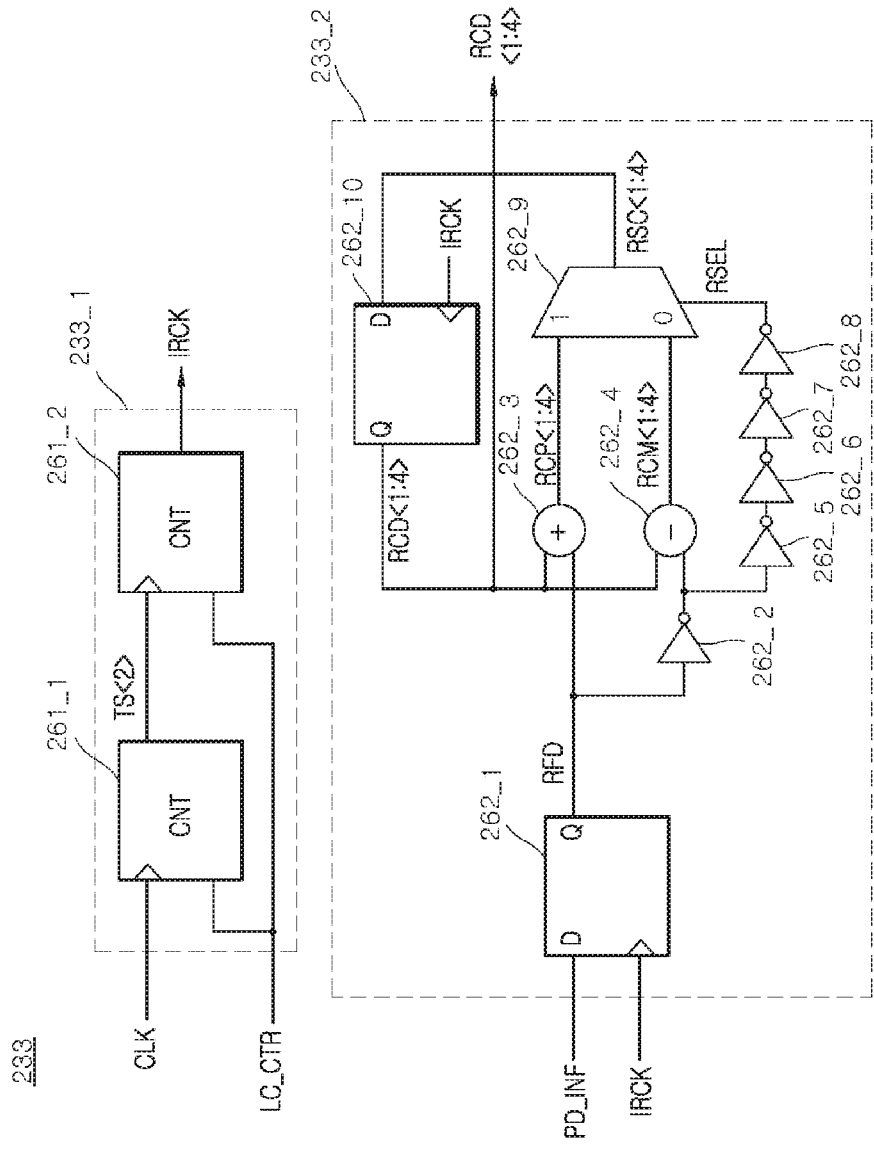
FIG. 8 is a diagram illustrating a configuration of a reference code generation circuit included in the delay amount control circuit illustrated in FIG. 5.

FIG. 8 is a diagram illustrating a configuration of the reference code generation circuit 233 in accordance with an embodiment. As illustrated in FIG. 8, the reference code generation circuit 233 may include an internal reference clock generation circuit 233_1 and a reference code control circuit 233_2.

The internal reference clock generation circuit 233_1 may be implemented using counters 261_1 and 261_2.

The counter 261_1 may generate a second transfer signal TS<2> which is disabled to a logic low level by the operation control signal LC_CTR. The counter 261_1 may generate the second transfer signal TS<2> which is enabled to a logic high level when a pulse of the clock CLK transitions from a logic high level to a logic low level. The counter 261_2 may generate an internal reference clock IRCK which is disabled to a logic low level by the operation control signal LC_CTR. The counter 261_2 may generate the internal reference clock IRCK which is enabled to a logic high level when a pulse of the second transfer signal TS<2> transitions from a logic high level to a logic low level.

The internal reference clock generation circuit 233_1 may generate the internal reference clock IRCK which is disabled by the operation control signal LC_CTR. The internal reference clock generation circuit 233_1 may generate the internal reference clock IRCK which is enabled in synchronization with the clock CLK. The internal reference clock generation circuit 233_1 may generate the internal reference clock IRCK which is reset by the operation control signal LC_CTR and then enabled when two pulses of the clock CLK are input after the internal reference clock IRCK is reset by the operation control signal LC_CTR.

The reference code control circuit 233_2 may include a flip-flop 262_1, an inverter 262_2, an adder 262_3, a subtractor 262_4, delay circuits 262_5 to 262_8, a selection transmitter 262_9 and a flip-flop 262_10.

The flip-flop 262_1 may output the phase detection signal PD_INF as a reference delay signal RFD in synchronization with the internal reference clock IRCK. The flip-flop 262_1 may output the phase detection signal PD_INF as the reference delay signal RFD when a pulse of the internal reference clock IRCK is input at a logic high level.

The inverter 262_2 may invert and buffer the reference delay signal RFD, and output the buffered signal.

The adder 262_3 may generate first to fourth reference addition codes RCP<1:4> by up-counting the first to fourth reference codes RCD<1:4> according to the logic level of the reference delay signal RFD. The adder 262_3 may generate the first to fourth reference addition codes RCP<1:4> by sequentially up-counting the first to fourth reference codes RCD<1:4> when the reference delay signal RFD is at a logic high level.

The subtractor 262_4 may generate first to fourth reference subtraction codes RCM<1:4> by down-counting the first to fourth reference codes RCD<1:4> according to the logic level of an output signal of the inverter 262_2. The subtractor 262_4 may generate the first to fourth reference subtraction codes RCM<1:4> by sequentially down-counting the first to fourth reference codes RCD<1:4> when the output signal of the inverter 262_2 is at a logic low level. That is, the subtractor 262_4 may generate the first to fourth reference subtraction codes RCM<1:4> by sequentially down-counting the first to fourth reference codes RCD<1:4> when the reference delay signal RFD is at a logic high level.

The delay circuits 262_5 to 262_8 may be implemented as an inverter chain. The delay circuits 262_5 to 262_8 may generate a reference selection signal RSEL by delaying the output signal of the inverter 262_2.

The selection transmitter 262_9 may output any ones of the first to fourth reference addition codes RCP<1:4> and the first to fourth reference subtraction codes RCM<1:4> as first to fourth reference selection codes RSC<1:4> according to the logic level of the reference selection signal RSEL. When the reference selection signal RSEL is at a logic low level, the selection transmitter 262_9 may output the first to fourth reference addition codes RCP<1:4> as the first to fourth reference selection codes RSC<1:4>. When the reference selection signal RSEL is at a logic high level, the selection transmitter 262_9 may output the first to fourth reference subtraction codes RCM<1:4> as the first to fourth reference selection codes RSC<1:4>.

The flip-flop 262_10 may output the first to fourth reference selection codes RSC<1:4> as the first to fourth reference codes RCD<1:4> in synchronization with the internal reference clock IRCK. The flip-flop 262_10 may output the first to fourth reference selection codes RSC<1:4> as the first to fourth reference codes RCD<1:4> when a pulse of the internal reference clock IRCK is input at a logic high level. FIG. 8 illustrates the flip-flop 262_10 as one flip-flop, but the flip-flop 262_10 may be implemented as four flip-flops for generating the first to fourth reference codes RCD<1:4>.

Figure 9:
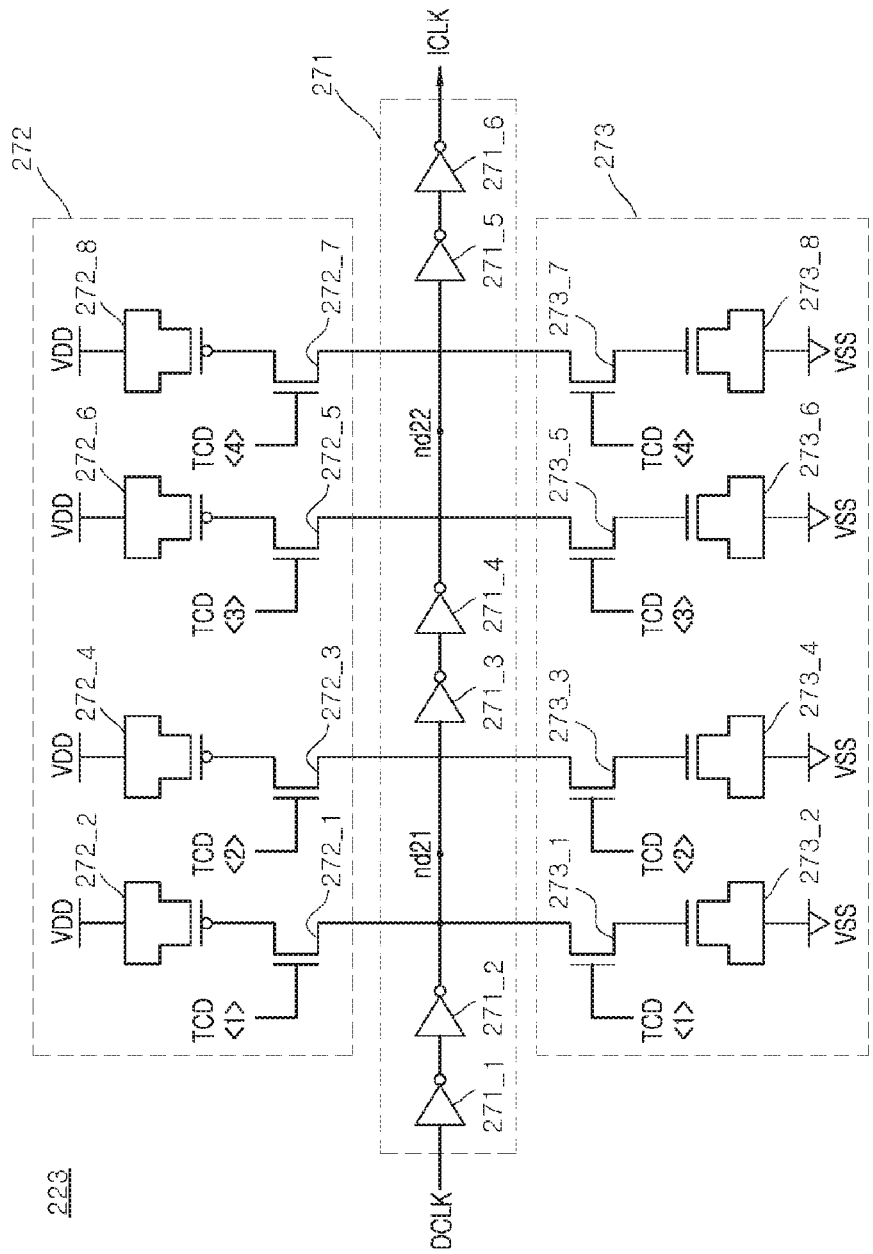
FIG. 9 is a circuit diagram illustrating a configuration of a target path circuit included in the internal clock generation circuit illustrated in FIG. 4.

FIG. 9 is a circuit diagram illustrating a configuration of the target path circuit 223 in accordance with an embodiment. As illustrated in FIG. 9, the target path circuit 223 may include a target delay path 271, a first charge supply circuit 272 and a second charge supply circuit 273.

The target delay path 271 may include inverters 271_1 to 271_6.

The inverters 271_1 and 271_2 may buffer the divided clock DCLK and output the buffered clock to a first node nd21. The inverters 271_1 and 271_2 may delay the divided clock DCLK and output the delayed clock to the first node nd21.

The inverters 271_3 and 271_4 may buffer the signal of the first node nd21 and output the buffered signal to a second node nd22. The inverters 271_3 and 271_4 may delay the signal of the first node nd21 and output the delayed signal to the second node nd22.

The inverters 271_5 and 271_6 may buffer the signal of the second node nd22 and output the buffered signal as the internal clock ICLK. The inverters 271_5 and 271_6 may delay the signal of the second node nd22 and output the delayed signal as the internal clock ICLK.

The target delay path 271 may generate the internal clock ICLK by delaying the divided clock DCLK.

The first charge supply circuit 272 may be implemented as NMOS transistors 272_1, 272_3, 272_5 and 272_7 and PMOS capacitors 272_2, 272_4, 272_6 and 272_8.

The NMOS transistor 272_1 and the PMOS capacitor 272_2 may be coupled in series between the first node nd21 and a supply voltage VDD. The NMOS transistor 272_1 may be turned on when the first target code signal TCD<1> is at a logic high level. The PMOS capacitor 272_2 may be coupled to the first node nd21 and supply charge, when the NMOS transistor 272_1 is turned on.

The NMOS transistor 272_3 and the PMOS capacitor 272_4 may be coupled in series between the first node nd21 and the supply voltage VDD. The NMOS transistor 272_3 may be turned on when the second target code signal TCD<2> is at a logic high level. The PMOS capacitor 272_4 may be coupled to the first node nd21 and supply charge, when the NMOS transistor 272_3 is turned on.

The NMOS transistor 272_5 and the PMOS capacitor 272_6 may be coupled in series between the second node nd22 and the supply voltage VDD. The NMOS transistor 272_5 may be turned on when the third target code signal TCD<3> is at a logic high level. The PMOS capacitor 272_6 may be coupled to the second node nd22 and supply charge, when the NMOS transistor 272_5 is turned on.

The NMOS transistor 272_7 and the PMOS capacitor 272_8 may be coupled in series between the second node nd22 and the supply voltage VDD. The NMOS transistor 272_7 may be turned on when the fourth target code signal TCD<4> is at a logic high level. The PMOS capacitor 272_8 may be coupled to the second node nd22 and supply charge, when the NMOS transistor 272_7 is turned on.

The first charge supply circuit 272 may include the PMOS capacitors 272_2, 272_4, 272_6 and 272_8 which are coupled to the first and second nodes nd21 and nd22 according to a logic level combination of the first to fourth target codes TCD<1:4>. The first charge supply circuit 272 may control the first delay variations of the first and second nodes nd21 and nd22 according to the couplings of the PMOS capacitors 272_2, 272_4, 272_6 and 272_8.

The second charge supply circuit 273 may be implemented as NMOS transistors 273_1, 273_3, 273_5 and 273_7 and NMOS capacitors 273_2, 273_4, 273_6 and 273_8.

The NMOS transistor 273_1 and the NMOS capacitor 273_2 may be coupled in series between the first node nd21 and a ground voltage VSS. The NMOS transistor 273_1 may be turned on when the first target code signal TCD<1> is at a logic high level. The NMOS capacitor 273_2 may be coupled to the first node nd21 and supply charge, when the NMOS transistor 273_1 is turned on.

The NMOS transistor 273_3 and the NMOS capacitor 273_4 may be coupled in series between the first node nd21 and the ground voltage VSS. The NMOS transistor 273_3 may be turned on when the second target code signal TCD<2> is at a logic high level. The NMOS capacitor 273_4 may be coupled to the first node nd21 and supply charge, when the NMOS transistor 273_3 is turned on.

The NMOS transistor 273_5 and the NMOS capacitor 273_6 may be coupled in series between the second node nd22 and the ground voltage VSS. The NMOS transistor 273_5 may be turned on when the third target code signal TCD<3> is at a logic high level. The NMOS capacitor 273_6 may be coupled to the second node nd22 and supply charge, when the NMOS transistor 273_5 is turned on.

The NMOS transistor 273_7 and the NMOS capacitor 273_8 may be coupled in series between the second node nd22 and the ground voltage VSS. The NMOS transistor 273_7 may be turned on when the fourth target code signal TCD<4> is at a logic high level. The NMOS capacitor 273_8 may be coupled to the second node nd22 and supply charge, when the NMOS transistor 273_7 is turned on.

The second charge supply circuit 273 may include the NMOS capacitors 273_2, 273_4, 273_6 and 273_8 which are coupled to the first and second nodes nd21 and nd22 according to a logic level combination of the first to fourth target codes TCD<1:4>. The second charge supply circuit 273 may control the first delay variations of the first and second nodes nd21 and nd22 according to the couplings of the NMOS capacitors 273_2, 273_4, 273_6 and 273_8.

The first delay variation may be controlled according to the numbers of the PMOS capacitors 272_2, 272_4, 272_6 and 272_8 and the NMOS capacitors 273_2, 273_4, 273_6 and 273_8. The first delay variation may be controlled by the charge quantities of the PMOS capacitors 272_2, 272_4, 272_6 and 272_8 and the NMOS capacitors 273_2, 273_4, 273_6 and 273_8. The delay variation by which the first delay variation is changed once may be set to 5 ps. For example, when the first to fourth target code signals TCD<1:4> are down-counted once, the first delay variation may be reduced by 5 ps.

The charge quantities of the PMOS capacitors 272_2, 272_4, 272_6 and 272_8 may be decided according to a width/length ratio. The width/length ratio of the PMOS capacitors 272_2 and 272_6 may be set to 2/1, and the width/length ratio of the PMOS capacitors 272_4 and 272_8 may be set to 2/2. The width/length ratios of the PMOS capacitors 272_2, 272_4, 272_6 and 272_8 may be set to various ratios according to an embodiment.

The charge quantities of the NMOS capacitors 273_2, 273_4, 273_6 and 273_8 may be decided according to a width/length ratio. The width/length ratio of the NMOS capacitors 273_2 and 273_6 may be set to 1/1, and the width/length ratio of the NMOS capacitors 273_4 and 273_8 may be set to 1/2. The width/length ratios of the NMOS capacitors 273_2, 273_4, 273_6 and 273_8 may be set to various ratios according to an embodiment.

Figure 10:
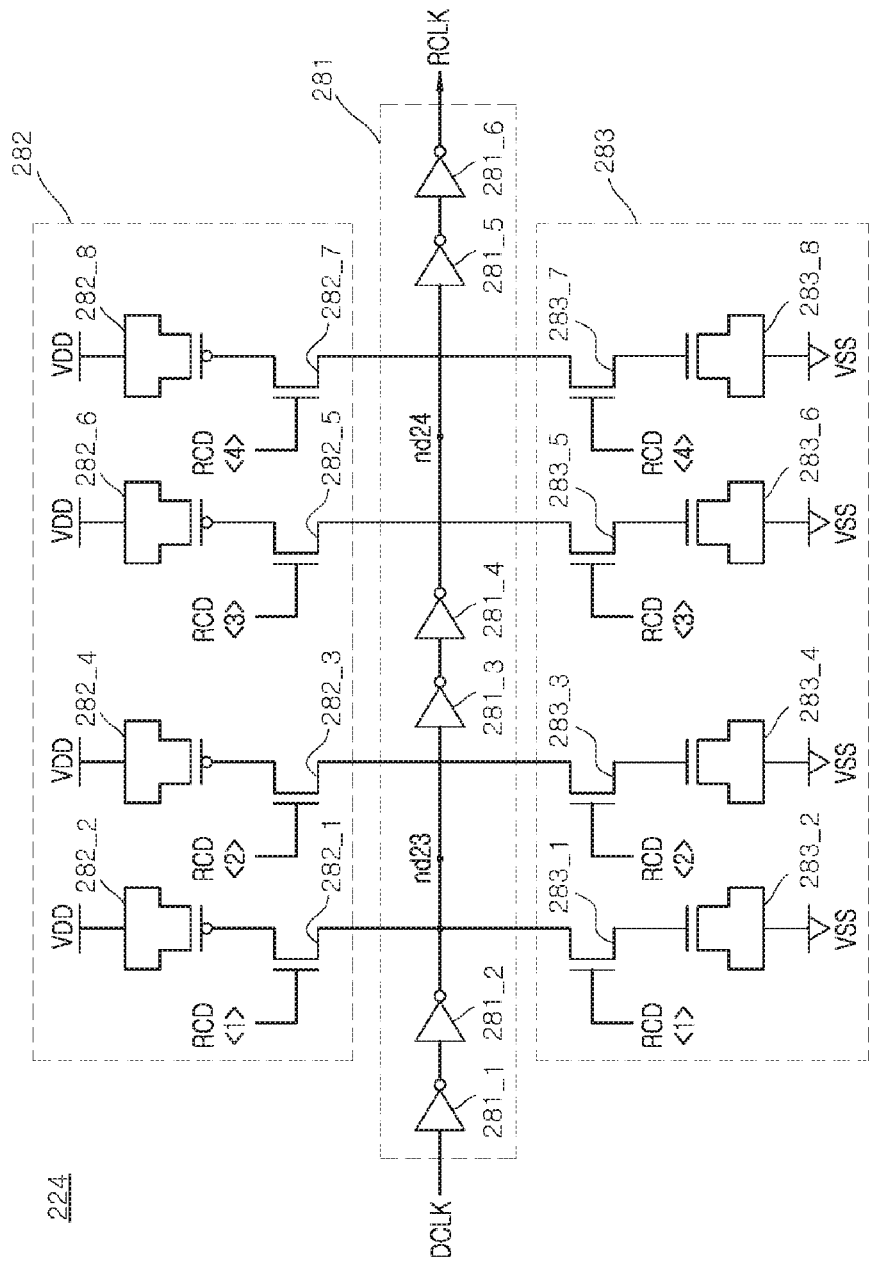
FIG. 10 is a circuit diagram illustrating a configuration of a reference path circuit included in the internal clock generation circuit illustrated in FIG. 4.

FIG. 10 is a circuit diagram illustrating a configuration of the reference path circuit 224 in accordance with an embodiment. As illustrated in FIG. 10, the reference path circuit 224 may include a reference delay path 281, a third charge supply circuit 282 and a fourth charge supply circuit 283.

The reference delay path 281 may include inverters 281_1 to 271_6.

The inverters 281_1 and 281_2 may buffer the divided clock DCLK and output the buffered clock to a third node nd23. The inverters 281_1 and 281_2 may delay the divided clock DCLK and output the delayed clock to the third node nd23.

The inverters 281_3 and 281_4 may buffer the signal of the third node nd23 and output the buffered signal to a fourth node nd24. The inverters 281_3 and 281_4 may delay the signal of the third node nd23 and output the delayed signal to the fourth node nd24.

The inverters 281_5 and 281_6 may buffer the signal of the fourth node nd24 and output the buffered signal as the reference clock RCLK. The inverters 281_5 and 281_6 may delay the signal of the fourth node nd24 and output the delayed signal as the reference clock RCLK.

The reference delay path 281 may generate the reference clock RCLK by delaying the divided clock DCLK.

The third charge supply circuit 282 may be implemented as NMOS transistors 282_1, 282_3, 282_5 and 282_7 and PMOS capacitors 282_2, 282_4, 282_6 and 282_8.

The NMOS transistor 282_1 and the PMOS capacitor 282_2 may be coupled in series between the third node nd23 and the supply voltage VDD. The NMOS transistor 282_1 may be turned on when the first reference code signal RCD<1> is at a logic high level. The PMOS capacitor 282_2 may be coupled to the third node nd23 and supply charge, when the NMOS transistor 282_1 is turned on.

The NMOS transistor 282_3 and the PMOS capacitor 282_4 may be coupled in series between the third node nd23 and the supply voltage VDD. The NMOS transistor 282_3 may be turned on when the second reference code signal RCD<2> is at a logic high level. The PMOS capacitor 282_4 may be coupled to the third node nd23 and supply charge, when the NMOS transistor 282_3 is turned on.

The NMOS transistor 282_5 and the PMOS capacitor 282_6 may be coupled in series between the fourth node nd24 and the supply voltage VDD. The NMOS transistor 282_5 may be turned on when the third reference code signal RCD<3> is at a logic high level. The PMOS capacitor 282_6 may be coupled to the fourth node nd24 and supply charge, when the NMOS transistor 282_5 is turned on.

The NMOS transistor 282_7 and the PMOS capacitor 282_8 may be coupled in series between the fourth node nd24 and the supply voltage VDD. The NMOS transistor 282_7 may be turned on when the fourth reference code signal RCD<4> is at a logic high level. The PMOS capacitor 282_8 may be coupled to the fourth node nd24 and supply charge, when the NMOS transistor 282_7 is turned on.

The third charge supply circuit 282 may include the PMOS capacitors 282_2, 282_4, 282_6 and 282_8 which are coupled to the third and fourth nodes nd23 and nd24 according to a logic level combination of the first to fourth reference codes RCD<1:4>. The third charge supply circuit 282 may control the second delay variations of the third and fourth nodes nd23 and nd24 according to the couplings of the PMOS capacitors 282_2, 282_4, 282_6 and 282_8.

The fourth charge supply circuit 283 may be implemented as NMOS transistors 283_1, 283_3, 283_5 and 283_7 and NMOS capacitors 283_2, 283_4, 283_6 and 283_8.

The NMOS transistor 283_1 and the NMOS capacitor 283_2 may be coupled in series between the third node nd23 and the ground voltage VSS. The NMOS transistor 283_1 may be turned on when the first reference code signal RCD<1> is at a logic high level. The NMOS capacitor 283_2 may be coupled to the third node nd23 and supply charge, when the NMOS transistor 283_1 is turned on.

The NMOS transistor 283_3 and the NMOS capacitor 283_4 may be coupled in series between the third node nd23 and the ground voltage VSS. The NMOS transistor 283_3 may be turned on when the second reference code signal RCD<2> is at a logic high level. The NMOS capacitor 283_4 may be coupled to the third node nd23 and supply charge, when the NMOS transistor 283_3 is turned on.

The NMOS transistor 283_5 and the NMOS capacitor 283_6 may be coupled in series between the fourth node nd24 and the ground voltage VSS. The NMOS transistor 283_5 may be turned on when the third reference code signal RCD<3> is at a logic high level. The NMOS capacitor 283_6 may be coupled to the fourth node nd24 and supply charge, when the NMOS transistor 283_5 is turned on.

The NMOS transistor 283_7 and the NMOS capacitor 283_8 may be coupled in series between the fourth node nd24 and the ground voltage VSS. The NMOS transistor 283_7 may be turned on when the fourth reference code signal RCD<4> is at a logic high level. The NMOS capacitor 283_8 may be coupled to the fourth node nd24 and supply charge, when the NMOS transistor 283_7 is turned on.

The fourth charge supply circuit 283 may include the NMOS capacitors 283_2, 283_4, 283_6 and 283_8 which are coupled to the third and fourth nodes nd23 and nd24 according to a logic level combination of the first to fourth reference codes RCD<1:4>. The fourth charge supply circuit 283 may control the second delay variations of the third and fourth nodes nd23 and nd24 according to the couplings of the NMOS capacitors 283_2, 283_4, 283_6 and 283_8.

The second delay variation may be controlled according to the numbers of the PMOS capacitors 282_2, 282_4, 282_6 and 282_8 and the NMOS capacitors 283_2, 283_4, 283_6 and 283_8. The second delay variation may be controlled according to the charge quantities of the PMOS capacitors 282_2, 282_4, 282_6 and 282_8 and the NMOS capacitors 283_2, 283_4, 283_6 and 283_8. The delay variation by which the second delay variation is changed once may be set to 10 ps. For example, when the first to fourth reference code signals RCD<1:4> are down-counted once, the first delay variation may be reduced by 10 ps.

The charge quantities of the PMOS capacitors 282_2, 282_4, 282_6 and 282_8 may be decided according to a width/length ratio. The width/length ratio of the PMOS capacitors 282_2 and 282_6 may be set to 4/1, and the width/length ratio of the PMOS capacitors 282_4 and 282_8 may be set to 4/2. The width/length ratios of the PMOS capacitors 282_2, 282_4, 282_6 and 282_8 may be set to various ratios according to an embodiment.

The charge quantities of the NMOS capacitors 283_2, 283_4, 283_6 and 283_8 may be decided according to a width/length ratio. The width/length ratio of the NMOS capacitors 283_2 and 283_6 may be set to 1/2, and the width/length ratio of the NMOS capacitors 283_4 and 283_8 may be set to 2/2. The width/length ratios of the NMOS capacitors 283_2, 283_4, 283_6 and 283_8 may be set to various ratios according to an embodiment.

Figure 11:
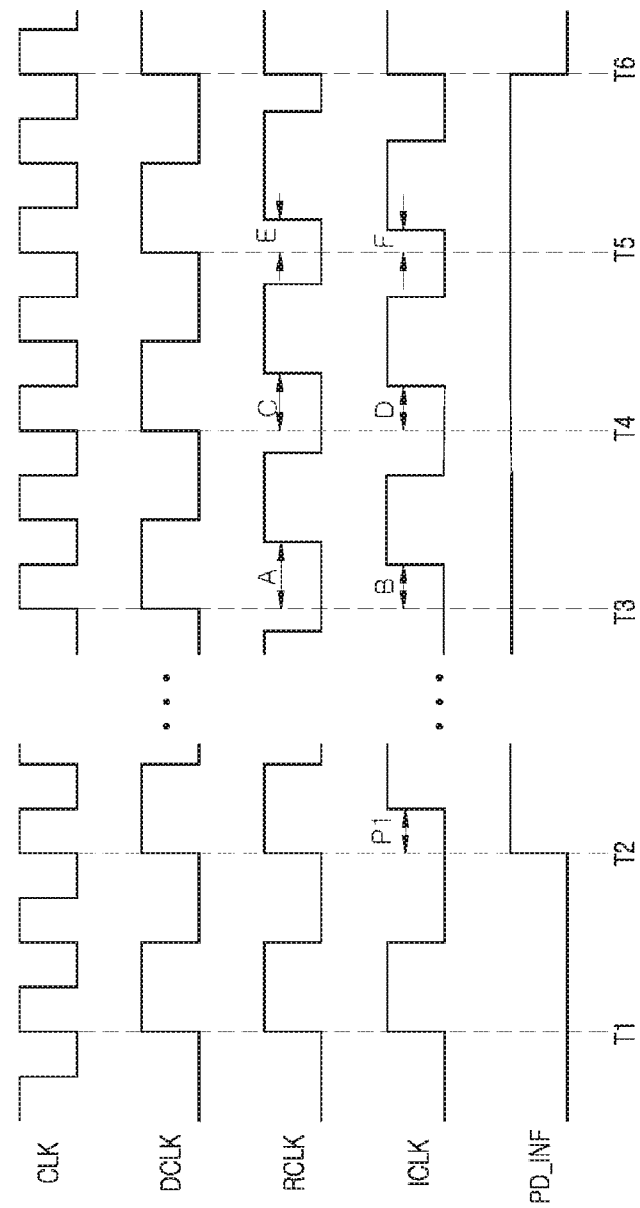
FIG. 11 is a timing diagram for describing an operation of the system for performing a phase control operation in accordance with an embodiment.

Referring to FIG. 11, the phase control operation of the system 1 for performing a phase control operation in accordance with an embodiment will be described. For example, the operation of controlling the internal clock ICLK and the reference clock RCLK to have the same phase by controlling the first and second delay variations, after a phase difference occurred between the internal clock ICLK and the reference clock RCLK due to a PVT variation, will be described as follows.

Before the description, the frequency divider circuit 221 generates the divided clock DCLK having a frequency corresponding to 1/2 of the frequency of the clock CLK, in synchronization with the clock CLK.

At a time point T1, the internal clock ICLK and the reference clock RCLK are in phase. At this time, because the internal clock ICLK and the reference clock RCLK are in phase, the detection circuit 225 generates the phase detection signal PD_INF disabled to a logic low level.

At a time point T2, the phases of the internal clock ICLK and the reference clock RCLK are changed due to a PVT change, and thus a phase difference P1 occurs. At this time, because the internal clock ICLK and the reference clock RCLK are out of phase, the detection circuit 225 generates the phase detection signal PD_INF enabled to a logic high level.

At a time point T3, the delay amount control circuit 222 generates the first to fourth reference codes RCD<1:4> which are down-counted by the logic-high phase detection signal PD_INF in synchronization with the clock CLK. The delay amount control circuit 222 generates the first to fourth target codes TCD<1:4> which are down-counted by the logic-high phase detection signal PD_INF in synchronization with the clock CLK.

The reference path circuit 224 may control a second delay variation A according to a logic level combination of the first to fourth reference codes RCD<1:4>. The reference path circuit 224 generates the reference clock RCLK by delaying the divided clock DCLK by the controlled second delay variation A. The second delay variation A is set to 30 ps.

The target path circuit 223 may control a first delay variation B according to a logic level combination of the first to fourth target codes TCD<1:4>. The target path circuit 223 generates the internal clock ICLK by delaying the divided clock DCLK by the controlled first delay variation B. The first delay variation B is set to 15 ps.

At a time point T4, the delay amount control circuit 222 generates the first to fourth reference codes RCD<1:4> which are down-counted by the logic-high phase detection signal PD_INF in synchronization with the clock CLK. The delay amount control circuit 222 generates the first to fourth target codes TCD<1:4> which are down-counted by the logic-high phase detection signal PD_INF in synchronization with the clock CLK.

The reference path circuit 224 may control a second delay variation C according to the logic level combination of the first to fourth reference codes RCD<1:4>. The reference path circuit 224 generates the reference clock RCLK by delaying the divided clock DCLK according to the controlled second delay variation C. The second delay variation C is set to 20 ps.

The target path circuit 223 may control a first delay variation D according to the logic level combination of the first to fourth target codes TCD<1:4>. The target path circuit 223 generates the internal clock ICLK by delaying the divided clock DCLK by the controlled first delay variation D. The first delay variation D is set to 10 ps.

At a time point T5, the delay amount control circuit 222 generates the first to fourth reference codes RCD<1:4> which are down-counted by the logic-high phase detection signal PD_INF in synchronization with the clock CLK. The delay amount control circuit 222 generates the first to fourth target codes TCD<1:4> which are down-counted by the logic-high phase detection signal PD_INF in synchronization with the clock CLK.

The reference path circuit 224 may control a second delay variation E according to the logic level combination of the first to fourth reference codes RCD<1:4>. The reference path circuit 224 generates the reference clock RCLK by delaying the divided clock DCLK by the controlled second delay variation E. The second delay variation E is set to 10 ps.

The target path circuit 223 may control a first delay variation F according to the logic level combination of the first to fourth target codes TCD<1:4>. The target path circuit 223 generates the internal clock ICLK by delaying the divided clock DCLK according to the controlled first delay variation F. The first delay variation F is set to 5 ps.

At a time point T6, because the internal clock ICLK and the reference clock RCLK are in phase, the detection circuit 225 generates the phase detection signal PD_INF disabled to a logic low level.

The delay amount control circuit 222 generates the first to fourth reference codes RCD<1:4> clamped by the logic-low phase detection signal PD_INF in synchronization with the clock CLK. The delay amount control circuit 222 generates the first to fourth target codes TCD<1:4> clamped by the logic-low phase detection signal PD_INF in synchronization with the clock CLK.

The reference path circuit 224 does not control the second delay variation according to the logic level combination of the first to fourth reference codes RCD<1:4>.

The target path circuit 223 does not control the first delay variation according to the logic level combination of the first to fourth target codes TCD<1:4>.

The internal clock generation circuit 203 may control the first and second delay variations for delaying the clock CLK, and generate the internal clock ICLK by delaying the clock CLK according to the controlled first and second delay variations, thereby controlling the phase of the internal clock ICLK according to a PVT variation.

The system for performing a phase control operation in accordance with the present embodiment may control the phase of the internal clock by differently controlling delay variations for different paths according to a PVT variation. Furthermore, the system for performing a phase control operation in accordance with the present embodiment may compensate for the phase of the internal clock according to a PVT variation and input/output data, thereby preventing an operation error.

Figure 12:
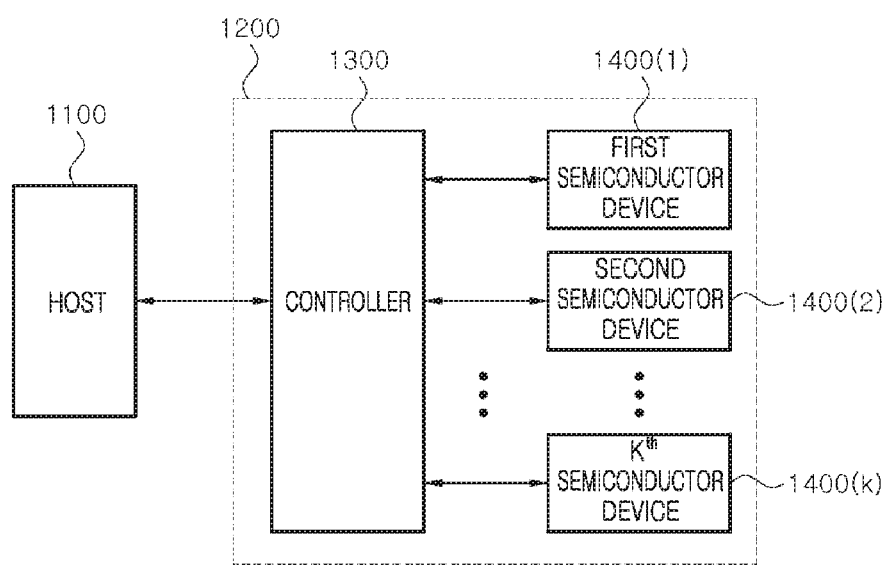
FIG. 12 is a diagram illustrating a configuration of an electronic system in accordance with an embodiment, to which the system for performing a phase control operation, illustrated in FIGS. 1 to 11, is applied.

FIG. 12 is a block diagram illustrating a configuration of an electronic system 1000 in accordance with an embodiment. As illustrated in FIG. 12, the electronic system 1000 may include a host 1100 and a semiconductor system 1200.

The host 1100 and the semiconductor system 1200 may transmit/receive signals to/from each other using an interface protocol. Examples of the interface protocol used between the host 1100 and the semiconductor system 1200 may include an MMC (Multi-Media Card), ESDI (Enhanced Small Disk Interface), IDE (Integrated Drive Electronics), PCI-E (Peripheral Component Interconnect-Express), ATA (Advanced Technology Attachment), SATA (Serial ATA), PATA (Parallel ATA), SAS (serial attached SCSI), USB (Universal Serial Bus) and the like.

The semiconductor system 1200 may include a controller 1300 and semiconductor devices 1400(K:1). The controller 1300 may control the semiconductor devices 1400(K:1) to perform a phase control operation. Each of the semiconductor devices 1400(K:1) may control the phase of an internal clock by differently controlling delay variations for different paths according to a PVT variation. Each of the semiconductor devices 1400(K:1) may compensate for the phase of the internal clock according to a PVT variation and input/output data, thereby preventing an operation error.

The controller 1300 may be implemented as the controller 110 illustrated in FIG. 1. Each of the semiconductor devices 1400(K:1) may be implemented as the semiconductor device 120 illustrated in FIG. 1. According to an embodiment, the semiconductor device 120 may be implemented as one of a DRAM (dynamic random access memory), PRAM (Phase change Random Access Memory), RRAM (Resistive Random Access Memory), MRAM (Magnetic Random Access Memory) and FRAM (Ferroelectric Random Access Memory).

While various embodiments have been described above, it will be understood to those skilled in the art that the embodiments described are examples only. Accordingly, the operating method of a data storage device described herein should not be limited based on the described embodiments.

What is claimed is:

1. A system for performing a phase control operation, comprising:
    an internal clock generation circuit configured to generate an internal clock by delaying a clock by a first delay variation, and generate a reference clock by delaying the clock by a second delay variation, wherein the internal clock generation circuit generates the internal clock by delaying the clock by the first delay variation which is controlled according to a phase difference between the internal clock and the reference clock, wherein the internal clock generation circuit generates the reference clock by delaying the clock by the second delay variation which is controlled according to the phase difference between the internal clock and the reference clock; and a data input and output (input/output) circuit configured to input/output data in synchronization with the internal clock.

2. The system of claim 1, wherein the second delay variation is set to a delay variation 2N times larger than the first delay variation.

3. The system of claim 1, wherein the first and second delay variations are set to a delay variation which is changed once whenever the phase difference between the internal clock and the reference clock is detected once.

4. The system of claim 1, wherein the internal clock generation circuit comprises:

a frequency divider circuit configured to generate a divided clock by dividing the frequency of the clock;

a delay amount control circuit configured to generate a target code and a reference code, having logic level combinations that are changed by a phase detection signal, in synchronization with the clock;

a target path circuit configured to have the first delay variation controlled according to the logic level combination of the target code, and generate the internal clock by delaying the divided clock by the controlled first delay variation;

a reference path circuit configured to have the second delay variation controlled according to the logic level combination of the reference code, and generate the reference clock by delaying the divided clock by the controlled second delay variation; and a detection circuit configured to generate the phase detection signal by comparing the phases of the internal clock and the reference clock.

5. The system of claim 4, wherein the delay amount control circuit comprises:

an operation control signal generation circuit configured to generate an operation control signal which is disabled by a reset signal, and enabled based on the phase detection signal in synchronization with the clock;

a target code generation circuit configured to generate the target code having the logic level combination that is changed according to the logic level of the phase detection signal, in synchronization with the clock; and a reference code generation circuit configured to generate the reference code having the logic level combination that is changed according to the logic level of the phase detection signal, in synchronization with the clock, after the operation control signal is enabled.

6. The system of claim 5, wherein the operation control signal generation circuit comprises:

a phase clock generation circuit configured to generate a phase clock which is disabled when the reset signal is input, and enabled in synchronization with the clock;

a phase delay signal generation circuit configured to generate a first phase delay signal and a second phase delay signal by sequentially shifting the phase detection signal according to the phase clock; and a latch circuit configured to generate the operation control signal which is disabled when the reset signal is input, and enabled when the first and second phase delay signals are different logic level combinations.

7. The system of claim 6, wherein the phase clock is enabled in synchronization with the clock when two pulses of the clock are input after the phase clock is reset by the reset signal, and wherein the latch circuit generates the operation control signal which is disabled when the first and second phase delay signals are at a same logic level combination.

8. The system of claim 5, wherein the target code generation circuit comprises:

an internal target clock generation circuit configured to generate an internal target clock which is disabled when the reset signal is input, and enabled in synchronization with the clock; and a target code control circuit configured to generate the target code having a logic level combination that is up-counted when the phase detection signal is at a first logic level, and generate the target code having a logic level combination that is down-counted when the phase detection signal is at a second logic level, in synchronization with the internal target clock.

9. The system of claim 8, wherein the internal target clock is enabled in synchronization with the clock when two pulses of the clock are input after the internal target clock is reset by the reset signal.

10. The system of claim 5, wherein the reference code generation circuit comprises:

an internal reference clock generation circuit configured to generate an internal reference clock which is disabled when the operation control signal is input, and enabled in synchronization with the clock; and a reference code control circuit configured to generate the reference code having a logic level combination that is up-counted when the phase detection signal is at a first logic level in synchronization with the internal reference clock, and generate the reference code having a logic level combination that is down-counted when the phase detection signal is at a second logic level.

11. The system of claim 10, wherein the internal reference clock is enabled in synchronization with the clock when two pulses of the clock are input after the internal reference clock is reset by the operation control signal.

12. The system of claim 4, wherein the target path circuit comprises:

a target delay path configured to delay the divided clock and output the delayed clock to a first node, and generate the internal clock by delaying the signal of the first node;

a first charge supply circuit comprising a first capacitor and a second capacitor which are coupled to the first and second nodes according to the logic level combination of the target code, and configured to control the first delay variations of the first and second nodes according to the coupling of the first and second capacitors; and a second charge supply circuit comprising a third capacitor and a fourth capacitor which are coupled to the first and second nodes according to the logic level combination of the target code, and configured to control the first delay variations of the first and second nodes according to the coupling of the third and fourth capacitors.

13. The system of claim 12, wherein the first to fourth capacitors are selectively coupled to the first and second nodes by the target code, and the first delay variation is controlled according to the number of the first to fourth capacitors which are selectively coupled.

14. The system of claim 13, wherein the first to fourth capacitors have a first charge quantity.

15. The system of claim 4, wherein the reference path circuit comprises:

a reference delay path configured to delay the divided clock and output the delayed clock to a third node, and generate the reference clock by delaying the signal of the third node;

a third charge supply circuit comprising a fifth capacitor and a sixth capacitor which are coupled to the third and fourth nodes according to the logic level combination of the reference code, and configured to control the second delay variations of the third and fourth nodes according to the coupling of the fifth and sixth capacitors; and a fourth charge supply circuit comprising a seventh capacitor and an eighth capacitor which are coupled to the third and fourth nodes according to the logic level combination of the reference code, and configured to control the second delay variations of the third and fourth nodes according to the coupling of the seventh and eighth capacitors.

16. The system of claim 15, wherein the fifth to eighth capacitors are selectively coupled to the third and fourth nodes by the reference code, and the second delay variation is controlled according to the number of the fifth to eighth capacitors which are selectively coupled.

17. The system of claim 16, wherein the fifth to eighth capacitors have a second charge quantity.

18. The system of claim 1, wherein the internal clock generation circuit generates the reference clock by delaying the clock by the second delay variation which is controlled according to the phase difference between the internal clock and the reference clock.

19. A system for performing a phase control operation, comprising:

a delay amount control circuit configured to generate first to fourth target codes and first to fourth reference codes, having logic level combinations that are changed by a phase detection signal, in synchronization with a clock;

a target path circuit configured to control a first delay variation according to the logic level combination of the first to fourth target codes, and generate an internal clock by delaying a divided clock according to the controlled first delay variation; and a reference path circuit configured to control a second delay variation according to the logic level combination of the first to fourth reference codes, and generate a reference clock by delaying the divided clock according to the controlled second delay variation.

20. The system of claim 19, wherein the phase detection signal is enabled when the internal clock and the reference clock are out of phase.

21. The system of claim 19, wherein the second delay variation is set to a delay variation 2N times larger than the first delay variation.

22. The system of claim 19, wherein the first and second delay variations are set to a delay variation which is changed once whenever a phase difference between the internal clock and the reference clock is detected once.

23. The system of claim 19, wherein the delay amount control circuit comprises:

an operation control signal generation circuit configured to generate an operation control signal which is disabled by a reset signal, and enabled based on the phase detection signal in synchronization with the clock;

a target code generation circuit configured to generate the first to fourth target codes having logic level combinations that are changed according to the logic level of the phase detection signal, in synchronization with the clock; and a reference code generation circuit configured to generate the reference code having logic level combinations that are changed according to the logic level of the phase detection signal, in synchronization with the clock, after the operation control signal is enabled.

24. The system of claim 23, wherein the operation control signal generation circuit comprises:

a phase clock generation circuit configured to generate a phase clock which is disabled when the reset signal is input, and enabled in synchronization with the clock;

a phase delay signal generation circuit configured to generate a first phase delay signal and a second phase delay signal by sequentially shifting the phase detection signal according to the phase clock; and a latch circuit configured to generate the operation control signal which is disabled when the reset signal is input, and enabled when the first and second phase delay signals are different logic level combinations.

25. The system of claim 23, wherein the target code generation circuit comprises:

an internal target clock generation circuit configured to generate an internal target clock which is disabled when the reset signal is input, and enabled in synchronization with the clock; and a target code control circuit configured to generate the first to fourth target codes having logic level combinations that are up-counted when the phase detection signal is at a first logic level in synchronization with the internal target clock, and generate the first to fourth target codes having logic level combinations that are down-counted when the phase detection signal is at a second logic level.

26. The electronic device of claim 23, wherein the reference code generation circuit comprises:

an internal reference clock generation circuit configured to generate an internal reference clock which is disabled when the operation control signal is input, and enabled in synchronization with the clock; and a reference code control circuit configured to generate the first to fourth reference codes having logic level combinations that are up-counted when the phase detection signal is at a first logic level, and generate the first to fourth reference codes having logic level combinations that are down-counted when the phase detection signal is at a second logic level, in synchronization with the internal reference clock.

27. The system of claim 19, wherein the target path circuit comprises:

a target delay path configured to delay the divided clock and output the delayed clock to a first node, and generate the internal clock by delaying the signal of the first node;

a first charge supply circuit comprising first to fourth capacitors which are coupled to the first and second nodes according to a logic level combination of the first to fourth target codes, and configured to control the first delay variations of the first and second nodes according to the couplings of the first to fourth capacitors; and a second charge supply circuit comprising fifth to eighth capacitors which are coupled to the first and second nodes according to a logic level combination of the first to fourth target codes, and configured to control the first delay variations of the first and second nodes according to the couplings of the fifth to eighth capacitors.

28. The system of claim 27, wherein the first to eighth capacitors have a first charge quantity.

29. The system of claim 19, wherein the reference path circuit comprises:
- a reference delay path configured to delay the divided clock and output the delayed clock to a third node, and generate the reference clock by delaying the signal of the third node;
- a third charge supply circuit comprising ninth to 12th capacitors which are coupled to the third and fourth nodes according to a logic level combination of the first to fourth reference codes, and configured to control the second delay variations of the third and fourth nodes according to the couplings of the ninth to 12th capacitors; and
- a fourth charge supply circuit comprising 13th to 16th capacitors which are coupled to the third and fourth nodes according to a logic level combination of the first to fourth reference codes, and configured to control the second delay variations of the third and fourth nodes according to the couplings of the 13th to 16th capacitors.

30. The system of claim 29, wherein the ninth to 16th capacitors have a second charge quantity.

31. A system for performing a phase control operation, comprising:
- an internal clock generation circuit configured to generate an internal clock by delaying a clock through a target path circuit, generate a reference clock by delaying the clock through a reference path circuit, and control a second delay variation of the reference path circuit after controlling a first delay variation of the target path circuit according to a phase difference between the internal clock and the reference clock; and
- a data input and output circuit configured to input and output data in synchronization with the internal clock.

* * * * *